(12) United States Patent
van der Wagt

(10) Patent No.: US 7,868,681 B2
(45) Date of Patent: Jan. 11, 2011

(54) PROGRAMMABLE GAIN CIRCUIT

(75) Inventor: Jan Paul van der Wagt, Carlsbad, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 138 days.

(21) Appl. No.: 11/929,241

(22) Filed: Oct. 30, 2007

(65) Prior Publication Data

US 2009/0108931 A1    Apr. 30, 2009

(51) Int. Cl.
H03L 5/00    (2006.01)
(52) U.S. Cl. .................... 327/308; 333/81 R
(58) Field of Classification Search .............. None
See application file for complete search history.

(56) References Cited

U.S. PATENT DOCUMENTS

| 5,448,207 | A | * | 9/1995 | Kohama ............... 333/81 R |
| 5,523,712 | A | | 6/1996 | Miyabe et al. |
| 5,796,286 | A | * | 8/1998 | Otaka ................. 327/308 |
| 6,300,814 | B1 | * | 10/2001 | Takahashi ............ 327/308 |
| 7,106,122 | B2 | * | 9/2006 | Behzad .............. 327/308 |
| 7,253,700 | B1 | | 8/2007 | Chiu |
| 2005/0174157 | A1 | * | 8/2005 | Calo' et al. .......... 327/308 |

FOREIGN PATENT DOCUMENTS

| EP | 0647024 | 4/1995 |
| EP | 0741452 | 11/1996 |
| JP | 57-055606 | 4/1982 |
| WO | 00018007 | 3/2000 |
| WO | 07032611 | 3/2007 |
| WO | 07033264 | 3/2007 |

OTHER PUBLICATIONS

International Search Report - PCT/US08/081709, International Searching Authority - European Patent Office, Sep. 28, 2009.
Written Opinion - PCT/US08/081709, International Searching Authority - European Patent Office, Sep. 28, 2009.

* cited by examiner

*Primary Examiner*—Cassandra Cox
(74) *Attorney, Agent, or Firm*—Ramin Mobarhan

(57) ABSTRACT

A programmable gain circuit suitable for a programmable gain amplifier is described. In one design, the programmable gain circuit includes multiple attenuation circuits coupled in series. Each attenuation circuit operates in a first mode or a second mode, attenuates an input signal in the first mode, and passes the input signal in the second mode. The multiple attenuation circuits may provide the same or different amounts of attenuation. The multiple attenuation circuits may include binary decoded attenuation circuits and/or thermometer decoded attenuation circuits. In one design, each attenuation circuit includes a divider circuit and at least one switch. The switch(es) select the first mode or the second mode. The divider circuit attenuates an input signal in the first mode and passes the input signal in the second mode. The programmable gain circuit may have a predetermined input impedance and a predetermined output impedance for all gain settings.

25 Claims, 11 Drawing Sheets

US 7,868,681 B2

PROGRAMMABLE GAIN CIRCUIT

BACKGROUND

I. Field

The present disclosure relates generally to electronics, and more specifically to a gain circuit and an amplifier.

II. Background

Amplifiers are commonly used to amplify signals to obtain the desired signal level. Amplifiers are widely used for various applications such as communication, computing, networking, consumer electronics, etc. For example, in a wireless communication device, amplifiers may be used to drive a headphone, a loudspeaker, an external device, etc.

An amplifier may have various requirements. For example, an amplifier may be required to provide a large range of gain and have small programmable gain steps. It may also be desirable for the amplifier to have robust performance and to occupy small layout area in order to reduce cost.

SUMMARY

A programmable gain circuit suitable for use in a programmable gain amplifier and with other circuits is described herein. In one design, the programmable gain circuit includes multiple attenuation circuits coupled in series. Each attenuation circuit may be operated in a first mode or a second mode and may attenuate an input signal in the first mode and pass (or not attenuate) the input signal in the second mode. The multiple attenuation circuits may provide the same or different amounts of attenuation. Multiple gain settings corresponding to different overall amounts of attenuation may be obtained by controlling each of the multiple attenuation circuits to operate in either the first or second mode.

In one design, the multiple attenuation circuits include a set of binary decoded attenuation circuits and a set of thermometer decoded attenuation circuits. The binary decoded attenuation circuits may provide different amounts of attenuation, e.g., by a factor of two in decibel (dB), and may be selected in any order. The selected binary decoded attenuation circuits may be determined based on a selected gain setting. The thermometer decoded attenuation circuits may provide equal amount of attenuation and may be selected in a predetermined order. The number of selected thermometer decoded attenuation circuits may be determined based on the selected gain setting.

The programmable gain circuit may have a predetermined input impedance and a predetermined output impedance for all of the gain settings. An amplifier may be coupled to the programmable gain circuit and may provide a fixed gain based on the output impedance of the programmable gain circuit and a feedback resistor.

In one design, each attenuation circuit includes a divider circuit and at least one switch. The at least one switch selects the first mode or the second mode for the attenuation circuit. The divider circuit attenuates an input signal in the first mode and passes the input signal in the second mode. The divider circuit may be implemented with a T resistor pad, a π resistor pad, etc., and may have a fixed input impedance and a fixed output impedance for both the first and second modes. In one design, the at least one switch comprises a single-pole double-throw (SPDT) switch that steers an intermediate current from the divider circuit to ground in the first mode or to an output of the programmable gain circuit in the second mode. In another design, the at least one switch comprises first and second switches. The first switch is coupled across an input and an output of the divider circuit. The second switch is coupled between an intermediate port of the divider circuit and ground. The first and second switches enable the divider circuit for the first mode and short out the divider circuit for the second mode.

Various aspects and features of the disclosure are described in further detail below.

DETAILED DESCRIPTION

Figure 1A:
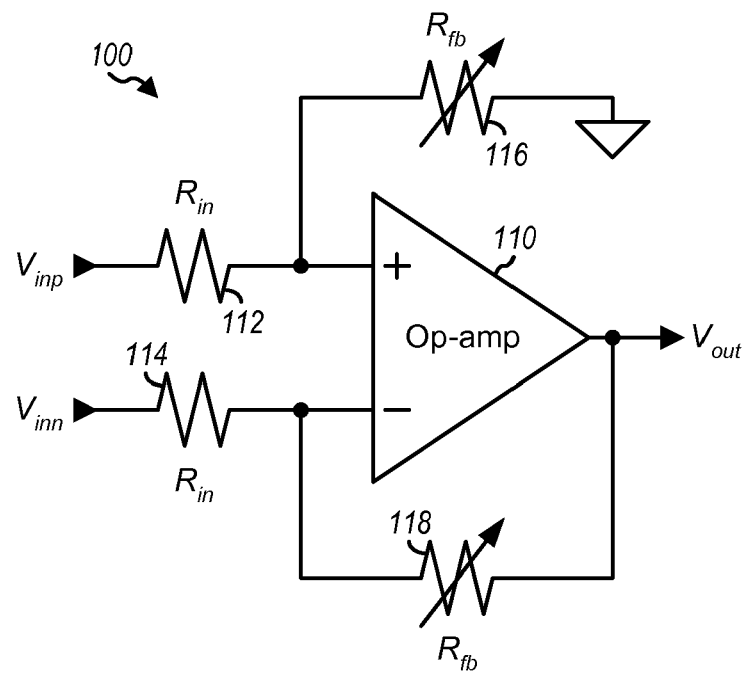
FIGS. 1A and 1B show variable gain amplifiers with variable feedback resistors and variable input resistors, respectively.

FIG. 1A shows a schematic diagram of a variable gain amplifier 100 with variable feedback resistors. Within amplifier 100, resistors 112 and 114 have one end receiving $V_{inp}$ and $V_{inn}$ signals, respectively, and the other end coupled to non-inverting and inverting inputs, respectively, of an operational amplifier (op-amp) 110. The $V_{inp}$ and $V_{inn}$ signals form a differential input signal for amplifier 100. A resistor 116 has one end coupled to the non-inverting input of op-amp 110 and the other end coupled to circuit ground. A resistor 118 has one end coupled to the inverting input and the other end coupled to the output of op-amp 110. Resistors 112 and 114 have fixed values of $R_{in}$, and resistors 116 and 118 have variable values of $R_{fb}$. Op-amp 110 provides signal amplification. Resistors 112 through 118 determine the gain G of amplifier 100, which may be expressed as:

$$G = \frac{R_{fb}}{R_{in}}. \qquad \text{Eq (1)}$$

In general and as used herein, a gain may be (i) equal to one in linear unit, which is zero dB in logarithm unit, (ii) greater than one in linear unit, or (iii) less than one in linear unit. A gain of greater than one in linear unit corresponds to signal amplification and a positive gain (in dB). A gain of less than one in linear unit corresponds to signal attenuation and a negative gain (in dB). Attenuation is negative gain, so that an attenuation of x dB is equivalent to a gain of −x dB.

The values of resistors 116 and 118 may be varied to adjust the gain of amplifier 100. Amplifier 100 may be required to provide a wide gain range, e.g., 54 dB, which corresponds to a maximum gain that is approximately 500 times a minimum gain. In this case, resistors 116 and 118 would need to be designed such that the largest value is approximately 500 times the smallest value. Such a large resistor ratio may degrade signal integrity and may further require a large resistor area, which may increase cost. Furthermore, when the feedback ratio of $R_{fb}$ to $R_{in}$ changes to vary the gain G, the loop gain and bandwidth as well as stray parasitics in the feedback loop may change, all of which may affect the stability of amplifier 100. Amplifier 100 would need to be designed such that stability can be ensured for the worst-case scenario.

Figure 1B:
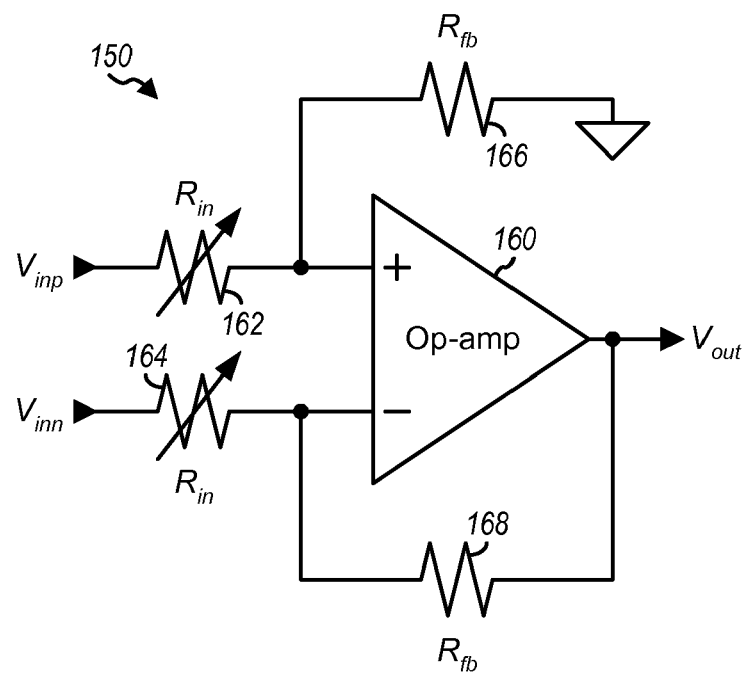

FIG. 1B shows a schematic diagram of a variable gain amplifier 150 with variable input resistors. Within amplifier 150, an op-amp 160 and resistors 162, 164, 166 and 168 are coupled in the same manner as op-amp 110 and resistors 112, 114, 116 and 118, respectively, in FIG. 1A. Resistors 162 and 164 have variable values of $R_{in}$, and resistors 166 and 168 have fixed values of $R_{fb}$. The gain of amplifier 150 may be determined as shown in equation (1). Since resistors 166 and 168 have fixed values, the stray parasitics in the feedback loop may not change with varying gain G, and no additional changes in stability may result from varying the gain. However, to obtain a wide gain range (e.g., 54 dB), resistors 162 and 164 may be designed such that the largest value is many times (e.g., 500 times) the smallest value. A large resistor ratio may degrade signal integrity and may further require a large resistor area.

Amplifier 150 may be designed to have variable values of $R_{in}$ for resistors 162 and 164 as well as variable values of $R_{fb}$ for resistors 166 and 168 (not shown in FIG. 1B). This may then allow the overall ratio to be partitioned between resistors 162 and 164 and resistors 166 and 168. For example, a gain range of 54 dB may be achieved with resistors 162 and 164 varying by a factor of 20 and resistors 166 and 168 varying by a factor of 25 to obtain a feedback ratio range of 500. However, stray parasitics in the feedback loop may still change due to varying $R_{fb}$, which may then result in additional stability variations.

In an aspect, a programmable gain amplifier may be implemented with a programmable gain circuit followed by a fixed gain amplifier. The fixed gain amplifier may have fixed values of $R_{fb}$ and may thus avoid changes in effects of stray parasitics on the stability of the feedback loop. The programmable gain circuit may support N different gain settings with approximately $\log_2(N)$ stages, where N may be any integer value. The programmable gain circuit may also provide a fixed input impedance and a fixed output impedance for all N gain settings.

Figure 2:
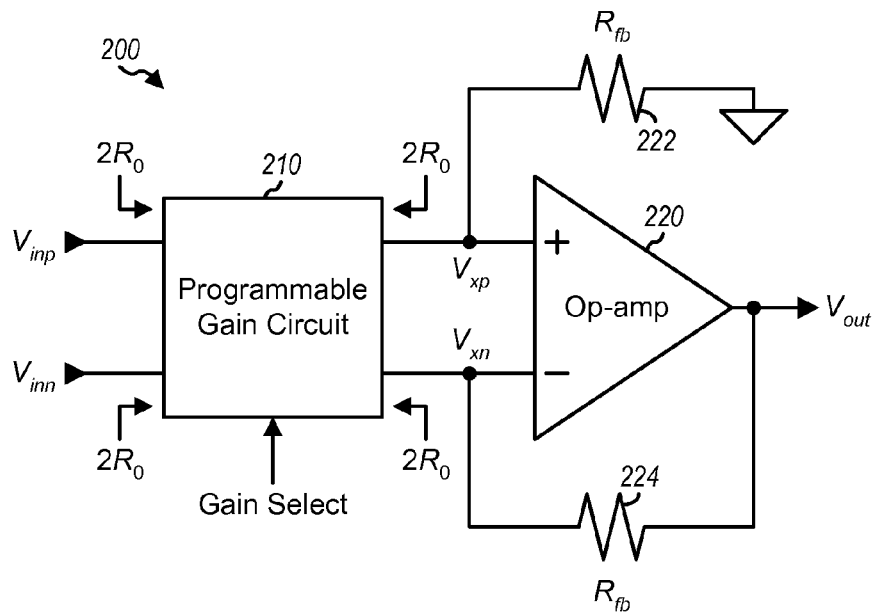
FIG. 2 shows a programmable gain amplifier with a programmable gain circuit.

FIG. 2 shows a schematic diagram of a design of a programmable gain amplifier 200. Within amplifier 200, a programmable gain circuit 210 has a differential input receiving the $V_{inp}$ and $V_{inm}$ signals for a differential input signal and a differential output coupled to the non-inverting and inverting inputs of an op-amp 220. A resistor 222 has one end coupled to the non-inverting input of op-amp 220 and the other end coupled to circuit ground. A resistor 224 is coupled between the inverting input and the output of op-amp 220. Resistors 222 and 224 have fixed values of $R_{fb}$. Op-amp 220 provides a single-ended output signal $V_{out}$.

Programmable gain circuit 210 has an input impedance of $2R_0$ looking into each input port of circuit 210 and an output impedance of $2R_0$ looking into each output port of circuit 210, as shown in FIG. 2. Circuit 210 attenuates the differential input signal by a variable amount of $G_{pgc}$, which is determined by a Gain Select signal. Op-amp 220 provides a fixed gain of $G_{op-amp}$, which is determined by the output impedance $2R_0$ of circuit 210 and the resistance $R_{fb}$ of resistors 222 and 224. The overall gain $G_{total}$ of amplifier 200 may be expressed as:

$$G_{total} = G_{pgc} \cdot G_{op-amp} = G_{pgc} \cdot \frac{R_{fb}}{2R_0}. \quad \text{Eq (2)}$$

In general, a programmable gain circuit may provide any range of gain and support any number of gain settings. A programmable gain circuit may be used with an amplifier such as an op-amp (e.g., as shown in FIG. 2) and may also be used with other circuits.

A programmable gain circuit may be implemented with one or more attenuation circuits. Each attenuation circuit may provide a particular amount of attenuation when selected and may provide no attenuation when bypassed. Each attenuation circuit may also have a fixed input impedance of $R_0$ and a fixed output impedance of $R_0$ when properly terminated. The matched input and output impedances may allow any number of attenuation circuits to be coupled in series.

Figure 3A:
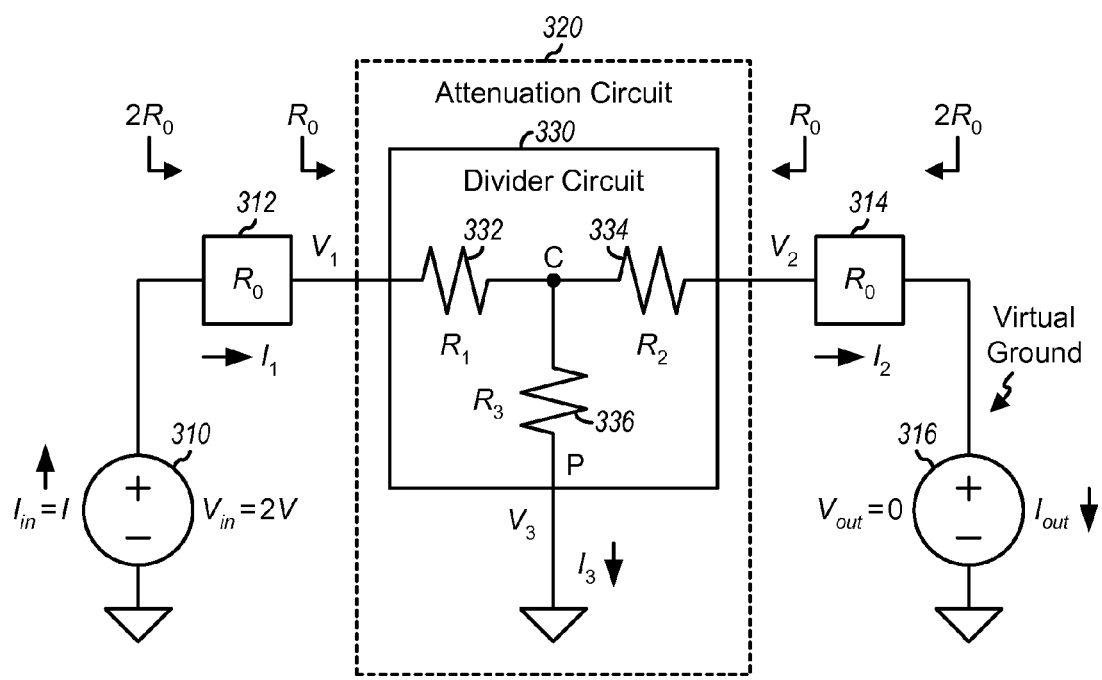
FIGS. 3A to 3C show three attenuation circuits with a T resistive pad.

FIG. 3A shows a schematic diagram of a design of an attenuation circuit 320. An input signal source 310 provides an input voltage of $V_{in}=2V$ and an input current of $I_{in}=I$, where V and I may be any suitable values and may change with time. An input resistor 312 has a value of $R_0$ and is coupled between signal source 310 and the input of attenuation circuit 320. An output resistor 314 also has a value of $R_0$ and is coupled between the output of attenuation circuit 320 and an output signal source 316. Signal source 316 models a low impedance circuit (e.g., the inverting input of an op-amp) to which attenuation circuit 320 may be coupled. The output of signal source 316 may be considered to be virtual ground.

Attenuation circuit 320 includes a divider circuit 330. Divider circuit 330 implements a T resistive pad formed with three resistors 332, 334 and 336. Resistor 332 has a value of $R_1$ and is coupled between the input of divider circuit 330 and a center node C. Resistor 334 has a value of $R_2$ and is coupled between the center node C and the output of divider circuit 330. Resistor 336 has a value of $R_3$ and is coupled between the center node C and an intermediate port P of divider circuit 330. In FIG. 3A, the intermediate port P is coupled to circuit ground.

Resistor values $R_1$, $R_2$ and $R_3$ may be selected to provide the desired amount of attenuation $G_{atten}$ for divider circuit 330. Furthermore, $R_1$, $R_2$ and $R_3$ may be selected such that attenuation circuit 320 has an input impedance of $R_0$ and an output impedance of $R_0$ when the input and output of attenuation circuit 320 are properly terminated with $R_0$, as shown in FIG. 3A.

Column 2 of Table 1 gives the values of $R_1$, $R_2$ and $R_3$ for a design in which divider circuit 330 provides 6 dB of attenuation. Column 2 also gives the values of various voltages and currents labeled in FIG. 3A.

TABLE 1 for 6 dB attenuator

| Parameter | Attenuation Circuit 320 | Attenuation Circuit 322 | Attenuation Circuit 322 | Attenuation Circuit 324 | Attenuation Circuit 324 |
|---|---|---|---|---|---|
| Gain | −6 dB | 0 dB | −6 dB | 0 dB | −6 dB |
| $R_1, R_2$ | $R_0/3$ | $R_0/3$ | $R_0/3$ | $R_0/3$ | $R_0/3$ |
| $R_3$ | $4R_0/3$ | $4R_0/3$ | $4R_0/3$ | $4R_0/3$ | $4R_0/3$ |

TABLE 1-continued for 6 dB attenuator

| Parameter | Attenuation Circuit 320 | Attenuation Circuit 322 | Attenuation Circuit 322 | Attenuation Circuit 324 | Attenuation Circuit 324 |
|---|---|---|---|---|---|
| $V_1$ | V | 3 V/2 | V | V | V |
| $V_2$ | V/2 | V | V/2 | V/2 | V/2 |
| $V_3$ | 0 | 2 V | 0 | 0 | 0 |
| $I_1$ | I | I/2 | I | I | I |
| $I_2$ | I/2 | I | I/2 | I/2 | I/2 |
| $I_3$ | I/2 | −I/2 | I/2 | I/2 | I/2 |
| $I_{out}$ | I/2 | I | I/2 | I | I/2 |

As shown in column 2 of Table 1, the output current $I_{out}$ through the virtual ground is one half (or −6 dB) of the input current $I_{in}=I$ from signal source 310. Other values of $G_{atten}$ (e.g., 1.5 dB, 3 dB, 12 dB, etc.) may be obtained with other values of $R_1$, $R_2$ and $R_3$, which may also be selected to provide fixed input and output impedances of $R_0$ for the attenuation circuit.

Attenuation circuit 320 may be viewed as a current attenuator that can steer some of the input current $I_1$ to the output port as current $I_2$ and the remaining part of $I_1$ to the intermediate port as current $I_3$. The ratio of the output current $I_2$ to the input current $I_1$ is equal to the attenuation $G_{atten}$ and is dependent on the selected values of $R_1$, $R_2$ and $R_3$ as well as the selected value of $R_0$. $R_0$ may be selected based on the application in which attenuation circuit 320 is used and may be equal to 50 or 75 ohms for radio frequency (RF) applications, 5K, 10K or 15K ohms for audio applications, etc.

Figure 3B:
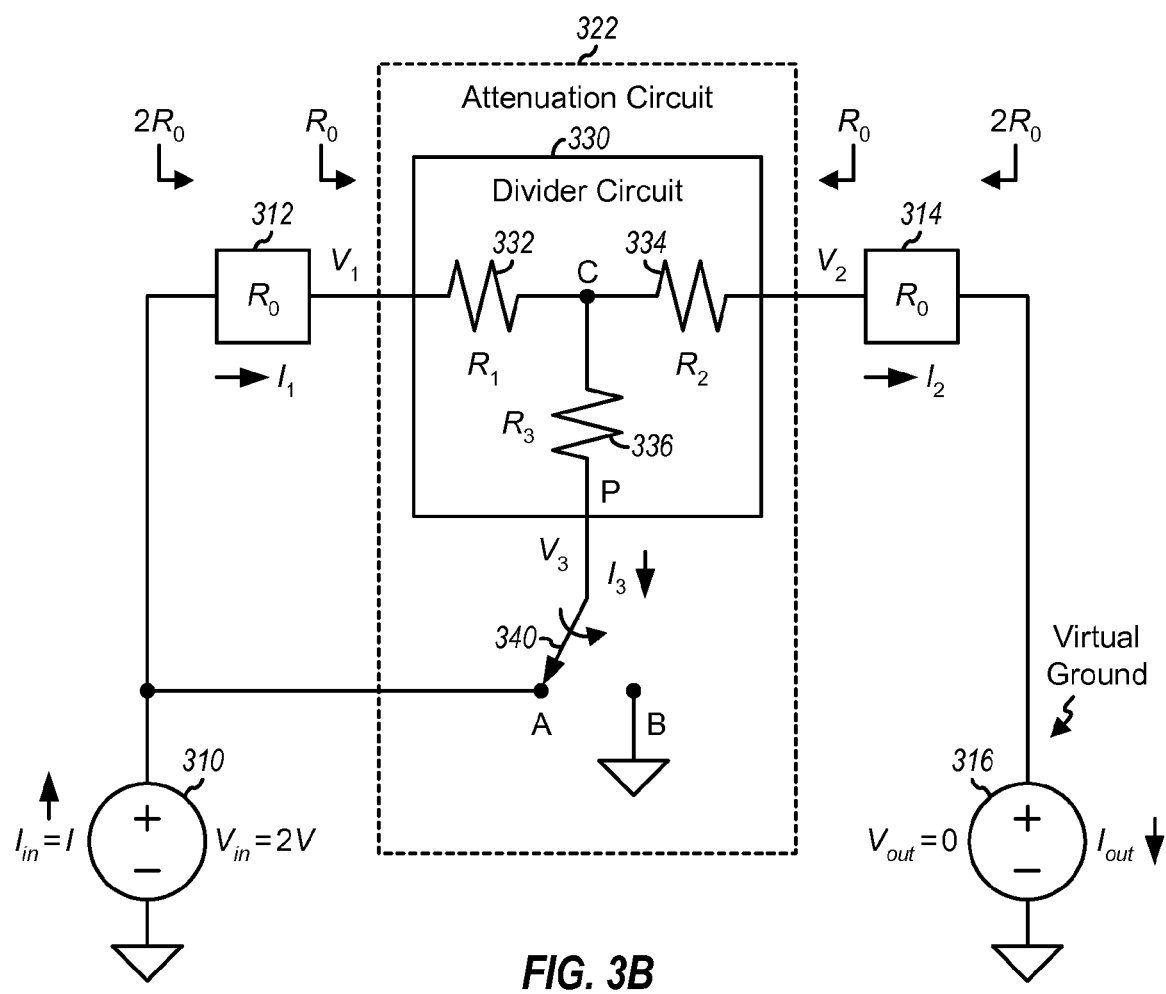

FIG. 3B shows a schematic diagram of a design of an attenuation circuit 322 that can provide an attenuation of either 0 dB or $G_{atten}$. Attenuation circuit 322 includes divider circuit 330 and a switch 340. Switch 340 is a single-pole double-throw (SPDT) switch having its single pole coupled to the intermediate port P of divider circuit 330, its first throw coupled to a node A (which is coupled to the output of signal source 310), and its second throw coupled to a node B (which is circuit ground).

Attenuation circuit 322 may be operated in a bypass mode or an attenuation mode. In the bypass mode, switch 340 is coupled to node A, and attenuation circuit 322 provides no attenuation (or 0 dB attenuation). In the attenuation mode, switch 340 is coupled to node B, and attenuation circuit 322 provides an attenuation of $G_{atten}$. $R_1$, $R_2$ and $R_3$ may be selected to provide the desired amount of attenuation $G_{atten}$ when attenuation circuit 322 is selected. $R_1$, $R_2$ and $R_3$ may also be selected such that attenuation circuit 322 has an input impedance of $R_0$ and an output impedance of $R_0$ with the proper input and output termination of $R_0$, as shown in FIG. 3B.

Columns 3 and 4 of Table 1 give the values of $R_1$, $R_2$ and $R_3$ for a design in which attenuation circuit 322 provides 6 dB of attenuation when selected. Column 3 also gives the values of various voltages and currents labeled in FIG. 3B when attenuation circuit 322 is in the bypass mode. Column 4 gives the values of various voltages and currents when attenuation circuit 322 is in the attenuation mode. As shown in column 3, the output current $I_{out}$ through the virtual ground is equal to the input current $I_{in}$ from signal source 310 in the bypass mode. As shown in column 4, the output current $I_{out}$ through the virtual ground is one half (or −6 dB) of the input current $I_{in}$ from signal source 310 in the attenuation mode. The input and output impedances of attenuation circuit 322 are equal to $R_0$ for both the bypass and attenuation modes.

In the design shown in FIG. 3B, switch 340 is coupled to either node A or node B at any given moment. Node B is at ground whereas node A is at the variable input voltage $V_{in}$. Switch 340 may be implemented with one or more metal oxide semiconductor field effect transistors (MOSFETs). The linearity of a MOSFET may improve when the source and drain of the MOSFET are coupled to fixed or small voltages instead of large variable voltages.

Figure 3C:
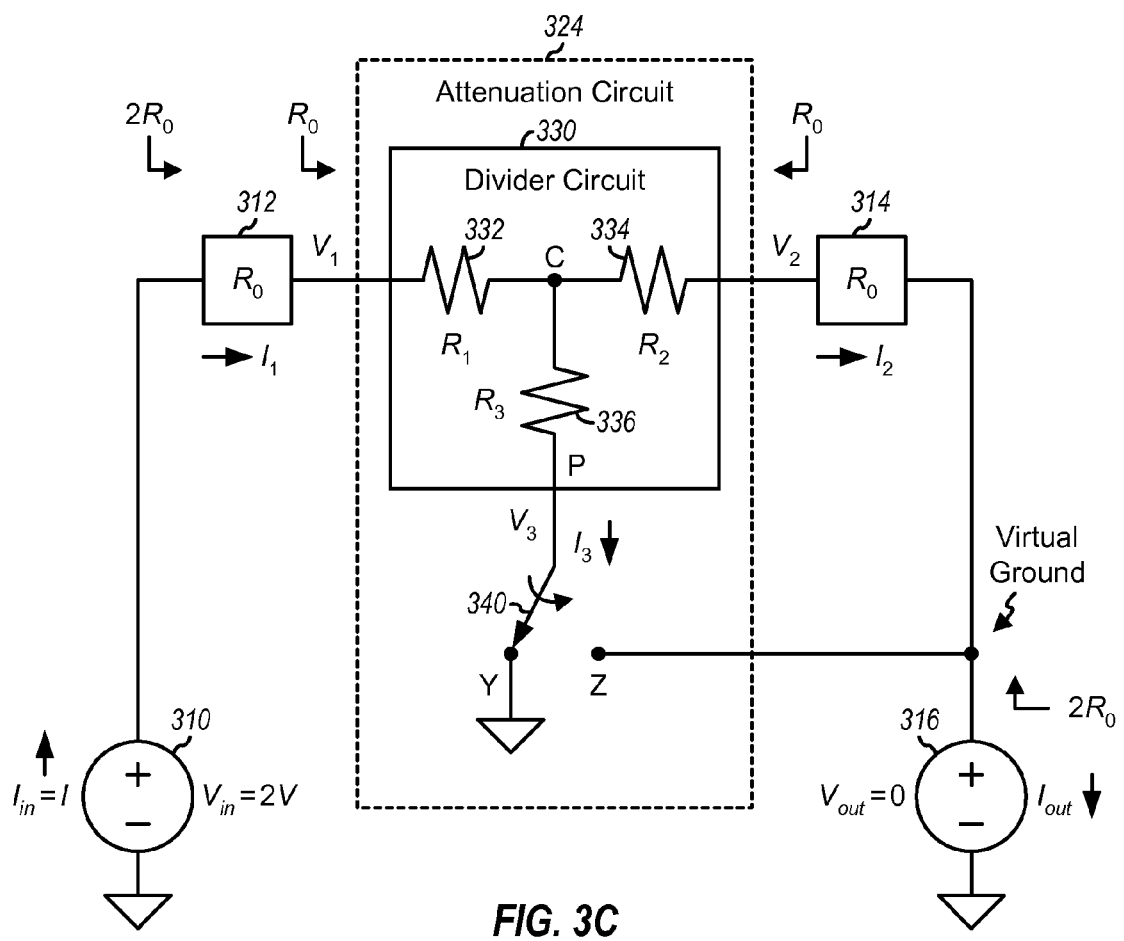

FIG. 3C shows a schematic diagram of a design of an attenuation circuit 324 that can provide an attenuation of either 0 dB or $G_{atten}$. Attenuation circuit 324 includes divider circuit 330 and switch 340. Switch 340 has its single pole coupled to the intermediate port P of divider circuit 330, its first throw coupled to a node Y (which is circuit ground), and its second throw coupled to a node Z (which is coupled to virtual ground at the output of signal source 316). Attenuation circuit 322 provides an attenuation of $G_{atten}$ when switch 340 is coupled to node Y and provides no attenuation when switch 340 is coupled to node Z. Since nodes Y and Z are at actual or virtual ground, the linearity of switch 340 may improve. Columns 5 and 6 of Table 1 give the values of various voltages and currents in FIG. 3C when attenuation circuit 324 is in the bypass mode and the attenuation mode, respectively.

As shown in FIGS. 3B and 3C, attenuation circuit 322 is reciprocal (i.e., symmetric) and may be flipped horizontally to obtain attenuation circuit 324. Attenuation circuits 322 and 324 have the same overall transfer function even though the values of the voltages and currents within attenuation circuit 324 may differ from the corresponding voltages and currents within attenuation circuit 322 for the bypass and attenuation modes.

Figure 4:
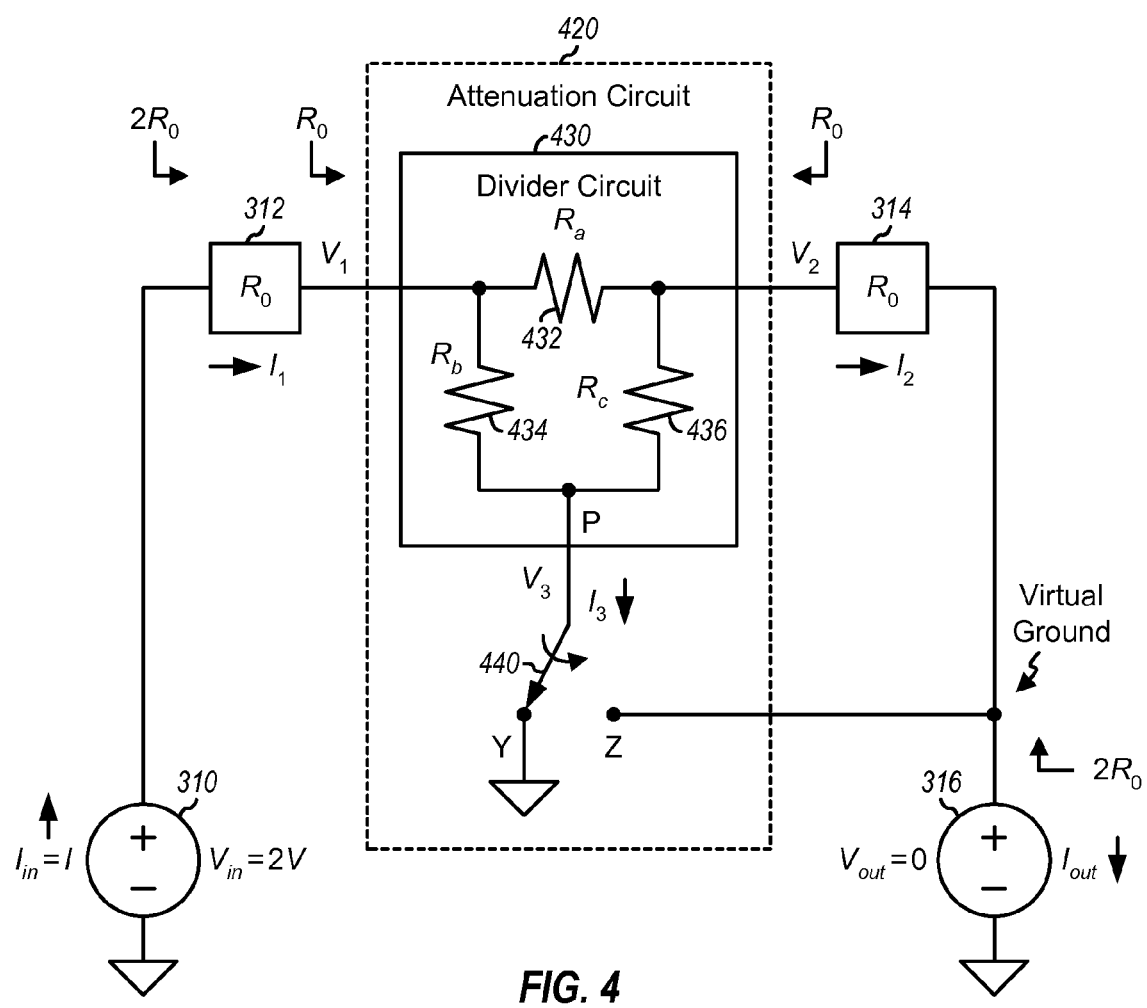
FIG. 4 shows an attenuation circuit with a π resistive pad.

FIG. 4 shows a schematic diagram of a design of an attenuation circuit 420 that can also provide an attenuation of either 0 dB or $G_{atten}$. Attenuation circuit 420 includes a divider circuit 430 and a switch 440 that are coupled in the same manner as divider circuit 330 and switch 340 in FIG. 3C.

Divider circuit 430 implements a π resistive pad formed with three resistors 432, 434 and 436. Resistor 432 has a value of $R_a$ and is coupled between the input and output of divider circuit 430. Resistor 434 has a value of $R_b$ and is coupled between the input and an intermediate port P of divider circuit 430. Resistor 436 has a value of $R_c$ and is coupled between the output and the intermediate port P of divider circuit 430. $R_a$, $R_b$ and $R_c$ may be selected such that attenuation circuit 420 provides the desired amount of attenuation $G_{atten}$ in the attenuation mode. $R_a$, $R_b$ and $R_c$ may further be selected such that attenuation circuit 420 has an input impedance of $R_0$ and an output impedance of $R_0$, with the proper input and output termination of $R_0$ for both the attenuation mode and the bypass mode.

Figure 5:
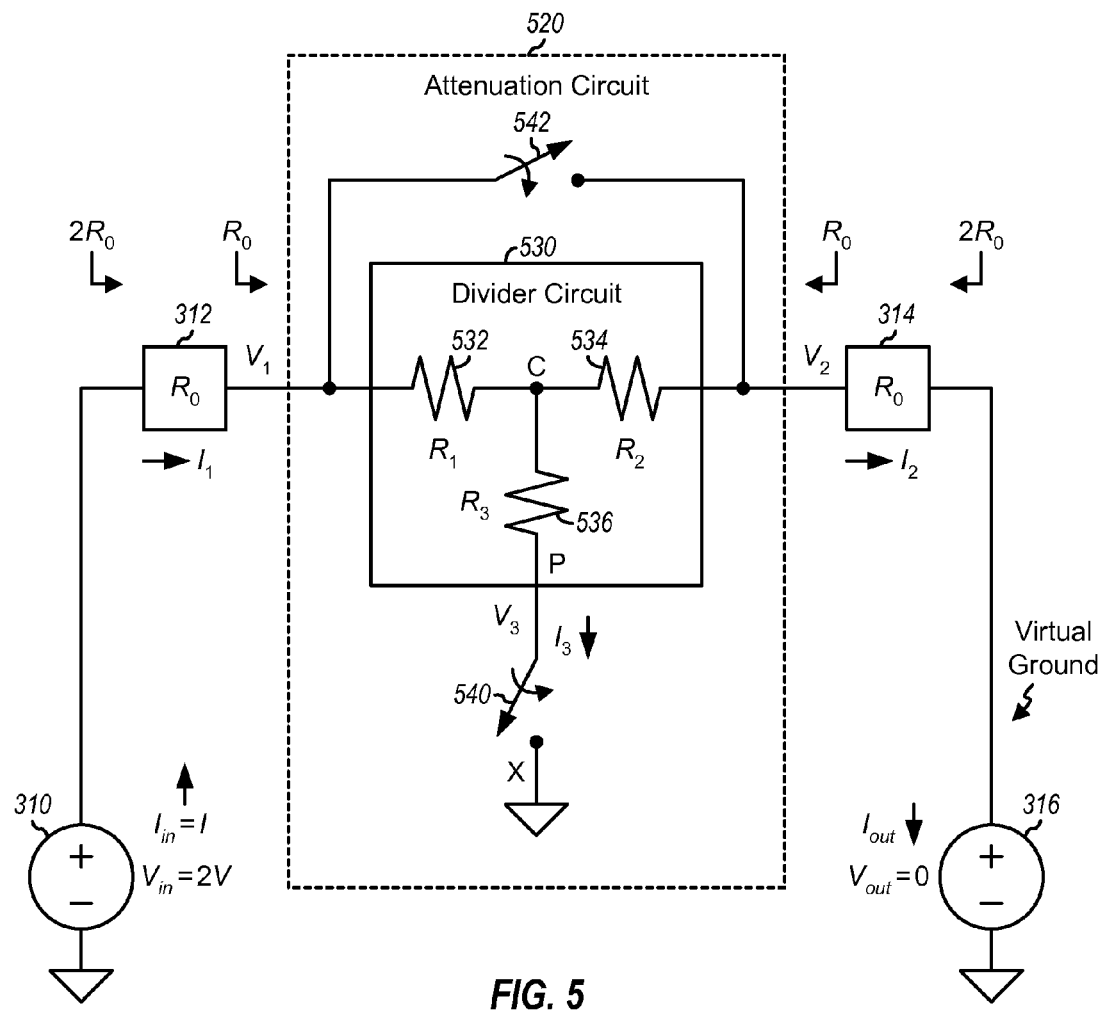
FIG. 5 shows another attenuation circuit with a T resistive pad.

FIG. 5 shows a schematic diagram of a design of an attenuation circuit 520 that can also provide an attenuation of either 0 dB or $G_{atten}$. Attenuation circuit 520 includes divider circuit 530 and switches 540 and 542. Divider circuit 530 implements a T resistive pad formed with three resistors 532, 534 and 536. Switch 540 has one end coupled to an intermediate port P of divider circuit 530 and the other end coupled to circuit ground. Switch 542 has one end coupled to the input of divider circuit 530 and the other end coupled to the output of divider circuit 530.

For the bypass mode, switch 542 is closed, switch 540 is opened, and divider circuit 530 is essentially shorted. In this mode, $V_2=V_1$ and $I_{out}=I_2=I_1=I_{in}$. For the attenuation mode, switch 542 is opened, switch 540 is closed, and divider circuit 530 is enabled. In this mode, $V_2$ is a fraction of $V_1$, and $I_2$ is a fraction of $I_1$, $R_1$, $R_2$ and $R_3$ may be selected such that attenuation circuit 520 (i) provides the desired amount of attenuation $G_{atten}$ in the attenuation mode and (ii) has input and output impedances of $R_0$ with the proper input and output termination, as shown in FIG. 5.

In the design shown in FIG. 5, switch 542 is located in the signal path when the bypass mode is selected. Switch 542 may be designed to have a sufficiently small "on" resistance and sufficiently small parasitic capacitance so that the input signal is not excessively degraded.

FIGS. 3B through 5 show some example designs of an attenuation circuit that may be operated in either the bypass mode or the attenuation mode. An attenuation circuit may also be implemented with other designs. In general, an attenuation circuit may use any type of divider circuit, e.g., a resistive pad formed with resistors, a capacitive pad formed with capacitors, etc. A resistive pad may be a T resistive pad, a π resistive pad, etc. An attenuation circuit may also have one or more switches that may be located anywhere within the attenuation circuit and may be operated in any manner to achieve the desired function.

For clarity, FIGS. 3A through 5 show a single attenuation circuit coupled between input signal source 310 and output signal source 316. Multiple attenuation circuits may be coupled in series to support more than two gain settings.

Figure 6:
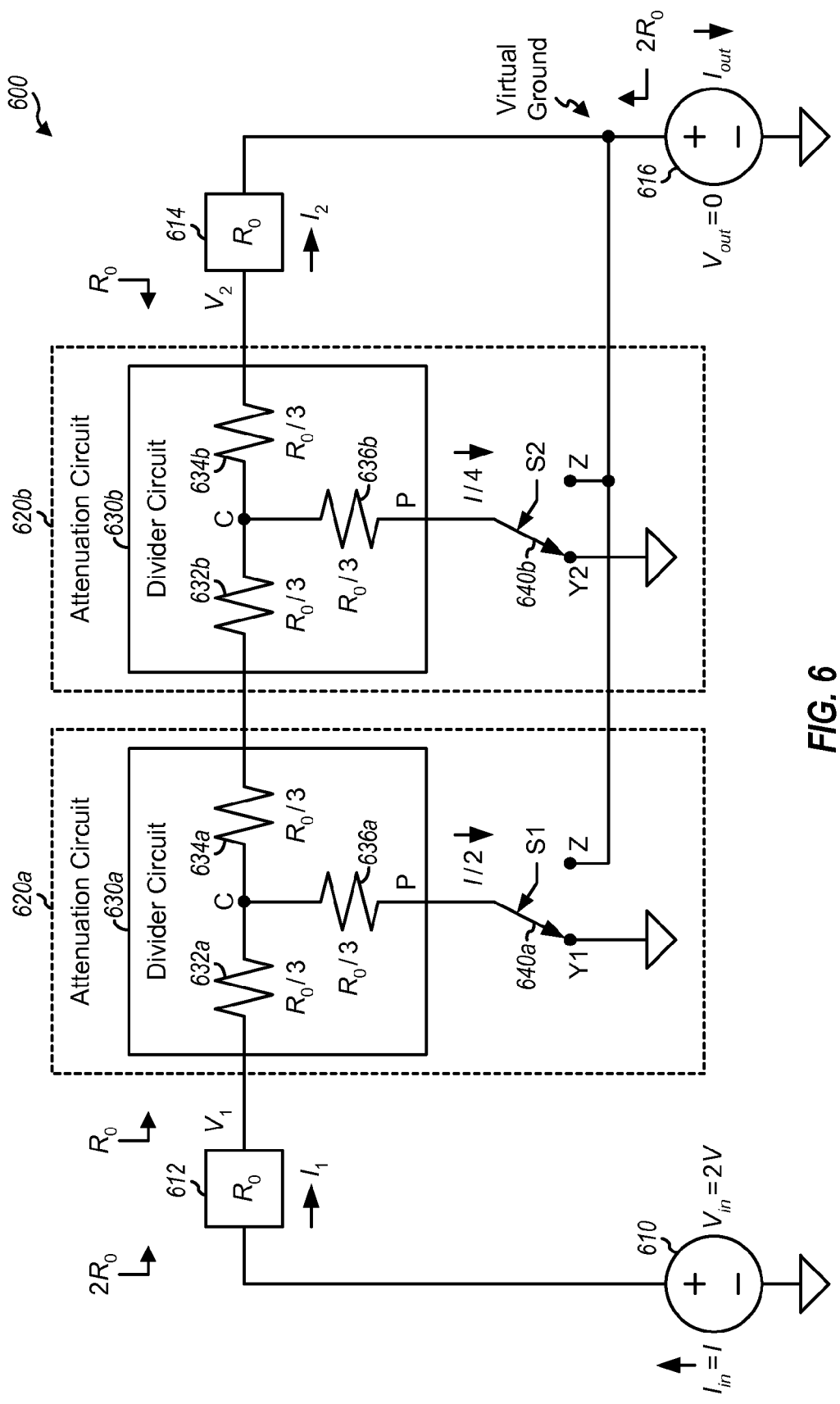
FIG. 6 shows a programmable gain circuit with two 6 dB attenuation circuits.

FIG. 6 shows a schematic diagram of a design of a programmable gain circuit 600 with two attenuation circuits 620a and 620b. Each attenuation circuit 620a includes a divider circuit 630 and a switch 640, which are coupled as described above for divider circuit 330 and switch 340 in FIG. 6C. Attenuation circuit 620a has its input coupled to an input resistor 612 and its output coupled to the input of attenuation circuit 620b. Attenuation circuit 620b has its output coupled to an output resistor 614. An input signal source 610 couples to resistor 612, and an output signal source 616 couples to resistor 614.

In each attenuation circuit 620, divider circuit 630 implements a T resistive pad formed with three resistors 632, 634 and 636. Resistors 632, 634 and 636 in each attenuation circuit 620 are designed to provide 6 dB of attenuation when that attenuation circuit is selected and have values of $R_0/3$. Switch 640a has its single pole coupled to an intermediate port P of divider circuit 630a, its first throw coupled to a node Y1 (which is circuit ground), and its second throw coupled to a node Z (which is coupled to the virtual ground at the output of signal source 616). Similarly, switch 640b has its single pole coupled to an intermediate port P of divider circuit 630b, its first throw coupled to a node Y2 (which is circuit ground), and its second throw coupled to node Z. Switch 640a is controlled by an S1 control signal and can steer an intermediate current of I/2 from port P of divider circuit 630a to either node Y1 or node Z. Switch 640b is controlled by an S2 control signal and can steer an intermediate current of I/4 from port P of divider circuit 630b to either node Y2 or node Z.

Table 2 shows the gain of programmable gain circuit 600 for four different gain settings determined by the S1 and S2 control signals. In Table 2, for each control signal S1 or S2, a value of "0" corresponds to the bypass mode and value of "1" corresponds to the attenuation mode. For each gain setting, the linear gain is given in column 3 and the dB gain is given in column 4.

TABLE 2

| S1 | S2 | Linear Gain | dB Gain | |
|----|----|----|----|----|
| 0 | 0 | 1.00 | 0 | use |
| 1 | 0 | 0.50 | −6 | use |
| 0 | 1 | 0.75 | −2.5 | don't use |
| 1 | 1 | 0.25 | −12 | use |

As shown by column 3 of Table 2, the gain of programmable gain circuit 600 may be varied in increments of 0.25 in linear unit. However, it may be desirable to adjust the gain of programmable gain circuit 600 in increments of 6 dB in log unit. In this case, the gain setting with S1=1 and S2=0 in the third row of Table 2 may be thrown out, i.e., not used. Programmable gain circuit 600 may then provide 0 dB gain with S1=S2=0 (both attenuation circuits 620a and 620b not selected), −6 dB gain with S1=0 and S2=1 (only attenuation circuit attenuation circuit 620b selected), and −12 dB gain with S1=S2=1 (both attenuation circuits 620a and 620b selected).

Figure 7:
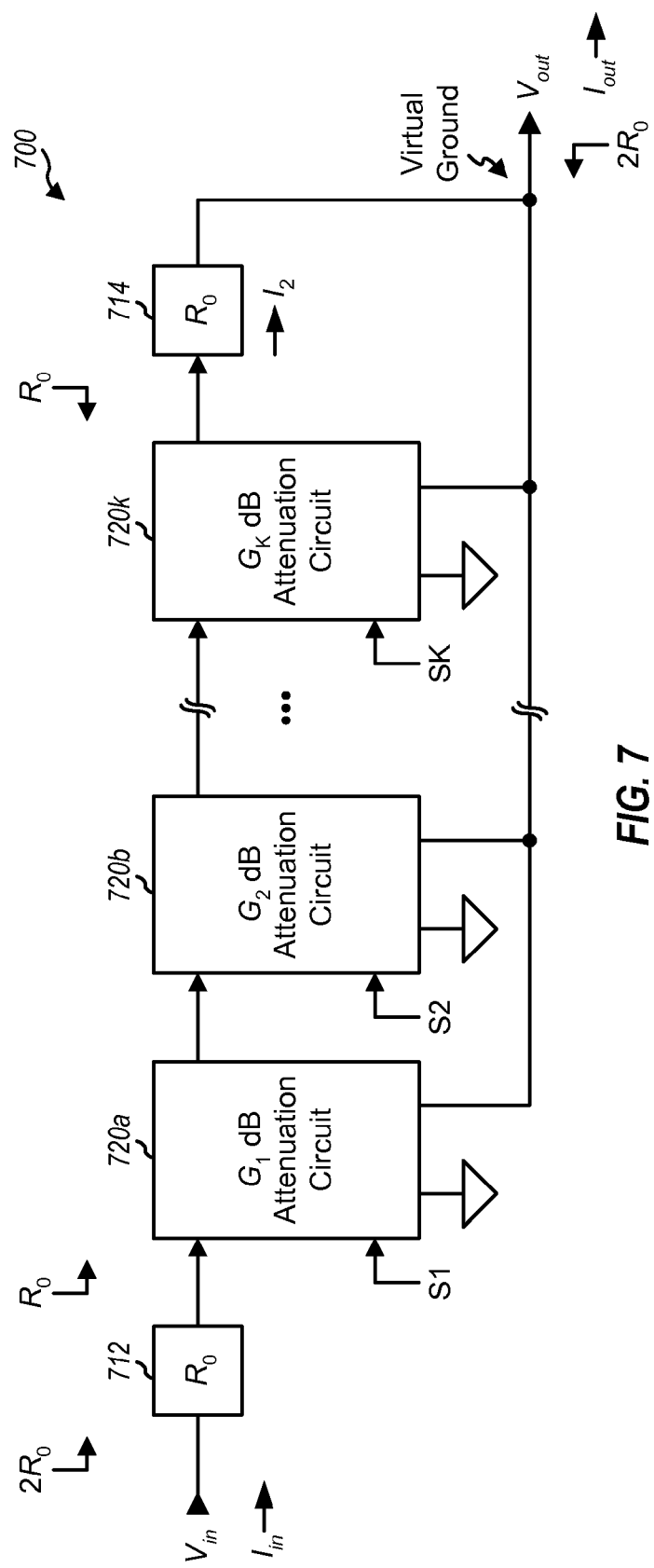
FIG. 7 shows a programmable gain circuit with multiple attenuation circuits.

FIG. 7 shows a schematic diagram of a design of a programmable gain circuit 700 with multiple (K) attenuation circuits 720a through 720k coupled in series, where K may be any integer value greater than one. An input resistor 712 receives an input signal $V_{in}$ at one end and has its other end coupled to an input of the first attenuation circuit 720a. Each attenuation circuit 720 (except for the last attenuation circuit 720k) has its output coupled to the input of the next attenuation circuit. An output resistor 714 has one end coupled to the output of the last attenuation circuit 720k and the other end coupled to an output of circuit 700, which may be virtual ground as shown in FIG. 7 or a low impedance node.

Each attenuation circuit 720 may be implemented with attenuation circuit 324 in FIG. 3C, attenuation circuit 420 in FIG. 4, attenuation circuit 520 in FIG. 5, or some other attenuation circuit. Each attenuation circuit 720 may operate in either the attenuation mode or the bypass mode based on its Sk control signal, where k∈{1, ..., K}. Attenuation circuits 720a through 720k may be designed to provide attenuation of $G_1$ through $G_K$, respectively, when selected. $G_1$ through $G_K$ may each be any suitable value and may be selected based on the application in which circuit 700 is used. Attenuation circuits 720a through 720k may be designed such that (i) each attenuation circuit can provide the desired amount of attenuation $G_k$ for that attenuation circuit when selected, (ii) the input impedance looking into the input of the first attenuation circuit 720a is $R_0$ for all gain settings, and (iii) the output impedance looking into the output of the last attenuation circuit 720k is also $R_0$ for all gain settings, assuming that the input and output of circuit 700 are properly terminated with $R_0$, as shown in FIG. 7.

In general, a programmable gain circuit may include any number of attenuation circuits coupled in series, and each attenuation circuit may provide any amount of attenuation when selected. The overall gain range, the number of gain settings, and the gain step may be selected based on the application in which the programmable gain circuit is used.

Figure 8:
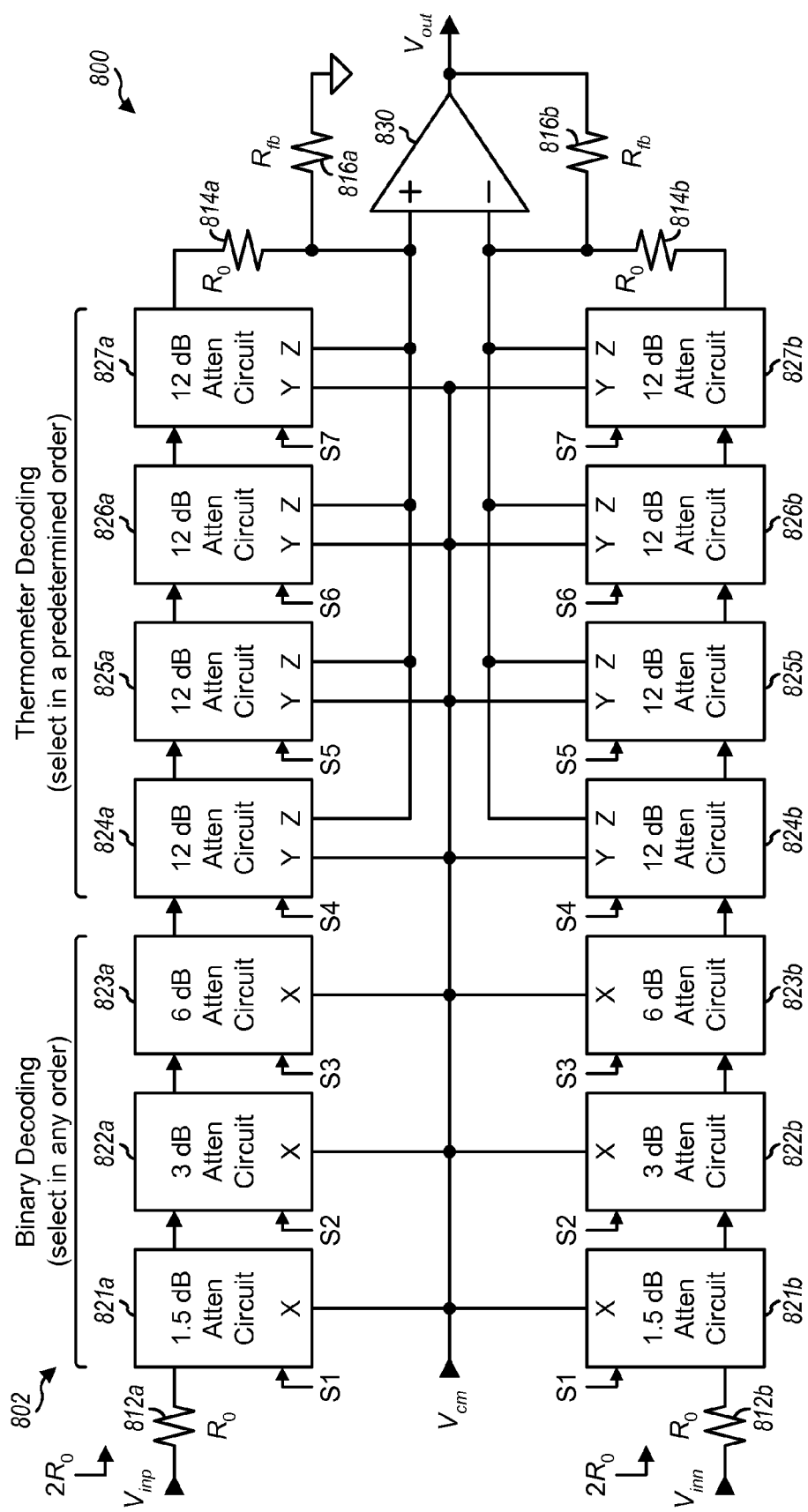
FIG. 8 shows a differential programmable gain amplifier with a programmable gain circuit.

FIG. 8 shows a schematic diagram of a design of a programmable gain amplifier 800 composed of a programmable gain circuit 802 followed by an op-amp 830. Amplifier 800 provides an overall gain range of 58.5 dB in steps of 1.5 dB and has a total of 40 gain settings. Amplifier 800 receives a differential input signal composed of the $V_{inp}$ and $V_{inn}$ signals and provides a single-ended output signal composed of the $V_{out}$ signal.

For the $V_{inp}$ signal path, programmable gain circuit 802 includes seven attenuation circuits 821a through 827a coupled in series. An input resistor 812a receives the $V_{inp}$ signal at one end and has its other end coupled to an input of the first attenuation circuit 821a. An output resistor 814a has one end coupled to the output of the last attenuation circuit 827a and the other coupled to a non-inverting input of op-amp 830. For the $V_{inn}$ signal path, programmable gain circuit 802 includes seven attenuation circuits 821b through 827b coupled in series. An input resistor 812b receives the $V_{inn}$ signal at one end and has its other end coupled to an input of the first attenuation circuit 821b. An output resistor 814b has one end coupled to the output of the last attenuation circuit 827b and the other coupled to an inverting input of op-amp 830. The $V_{inn}$ signal path is essentially a mirror image of the $V_{inn}$ signal path.

A resistor 816a has one end coupled to the non-inverting input of op-amp 830 and the other end coupled to circuit ground. A feedback resistor 816b is coupled between the inverting input and the output of op-amp 830.

In the design shown in FIG. 8, three attenuation circuits 821 through 823 in each input signal path are implemented with binary decoding and provide different amounts of attenuation by a factor of two in dB. Attenuation circuit 821 provides an attenuation of 1.5 dB when selected, attenuation circuit 822 provides an attenuation of 3 dB when selected, and attenuation circuit 823 provides an attenuation of 6 dB when selected. Each of attenuation circuits 821a through 823b may be implemented with attenuation circuit 520 in FIG. 5. Node X of each of attenuation circuits 821a through 823b corresponds to node X in FIG. 5. The X nodes of attenuation circuits 821a through 823b are coupled to a common mode node $V_{cm}$, which is a low impedance node having a DC voltage that is approximately half of the average voltages of the $V_{inp}$ and $V_{inn}$ signals. Each of attenuation circuits 821a through 823a steers all of its input current $I_1$ to the output in the bypass mode and steers its intermediate current $I_3$ to node $V_{cm}$ in the attenuation mode, as described above for FIG. 5.

steers its intermediate current $I_3$ to the non-inverting input of op-amp 830 in the bypass mode and to node $V_{cm}$ in the attenuation mode. Each of attenuation circuits 824b through 827b steers its intermediate current $I_3$ to the inverting input of op-amp 830 in the bypass mode and to node $V_{cm}$ in the attenuation mode.

The three pairs of attenuation circuit 821a and 821b, 822a and 822b, and 823a and 823b may be selected in any order and independently of one another. Attenuation circuits 821a and 821b may be selected to provide an attenuation of 1.5 dB, attenuation circuits 822a and 822b may be selected to provide an attenuation of 3 dB, and attenuation circuits 823a and 823b may be selected to provide an attenuation of 6 dB. Each attenuation circuit that is selected steers its intermediate current $I_3$ to node $V_{cm}$, which then provides attenuation.

The four pairs of attenuation circuit 824a and 824b, 825a and 825b, 826a and 826b, and 827a and 827b may be selected in a predetermined order to obtain attenuation in 12 dB steps. Attenuation circuits 824a and 824b may be selected first to provide an attenuation of 12 dB, attenuation circuits 825a and 825b may further be selected next to provide an attenuation of 24 dB, attenuation circuits 826a and 826b may further be selected next to provide an attenuation of 36 dB, and attenuation circuits 827a and 827b may further be selected last to provide an attenuation of 48 dB. Each attenuation circuit that is selected steers its intermediate current $I_3$ to node $V_{cm}$, which then provides attenuation. Each attenuation circuit that is not selected steers its intermediate current $I_3$ to either the non-inverting or inverting input of op-amp 830, which then provides no attenuation.

Table 3 gives the values of $R_0$, $R_1$, $R_2$ and $R_3$ for each attenuation circuit in FIG. 8. Table 3 assumes a design in which each of attenuation circuits 821a through 823b is implemented as shown in FIG. 5, and each of attenuation circuits 824a through 827b is implemented as shown in FIG. 3C.

TABLE 3

| Parameter | Atten Circuit 821 | Atten Circuit 822 | Atten Circuit 823 | Atten Circuit 824 | Atten Circuit 825 | Atten Circuit 826 | Atten Circuit 827 |
|---|---|---|---|---|---|---|---|
| Gain | −1.5 dB | −3 dB | −6 dB | −12 dB | −12 dB | −12 dB | −12 dB |
| $R_0$ | 15 KΩ | 15 KΩ | 15 KΩ | 15 KΩ | 15 KΩ | 15 KΩ | 15 KΩ |
| $R_1$, $R_2$ | 1.30 KΩ | 2.57 KΩ | 5 KΩ | 9 KΩ | 9 KΩ | 9 KΩ | 9 KΩ |
| $R_3$ | 86.1 KΩ | 42.4 KΩ | 20 KΩ | 8 KΩ | 8 KΩ | 8 KΩ | 8 KΩ |
| Control | select in any order | select in any order | select in any order | select first | select second | select third | select fourth |

In the design shown in FIG. 8, four attenuation circuits 824 through 827 in each input signal path are implemented with thermometer decoding and provide the same amount of attenuation. Each attenuation circuit provides an attenuation of 12 dB when selected. Each of attenuation circuits 824a through 827b may be implemented with attenuation circuit 324 in FIG. 3C or attenuation circuit 420 in FIG. 4. Node Y of each of attenuation circuits 824a through 827b corresponds to node Y in FIG. 3C or 4, and node Z corresponds to node Z in FIG. 3C or 4. The Z nodes of attenuation circuits 824a through 827a are coupled to the non-inverting input of op-amp 830. The Z nodes of attenuation circuits 824b through 827b are coupled to the inverting input of op-amp 830. The Y nodes of attenuation circuits 824a through 827b are coupled to node $V_{cm}$. Each of attenuation circuits 824a through 827a For the design shown in FIG. 8, a 6-bit Gain Select signal composed of bits b1 through b6 may be used to select one of 40 gain settings. The Gain Select signal may range from b6 . . . b1=000000 (binary) for the largest gain setting of 0 dB to b6 . . . b1=100111 (binary) for the smallest gain setting of −58.5 dB. For a gain setting of x (decimal), the amount of attenuation is 1.5x dB, where x ranges from 0 to 39. The S1 through S7 control signals for the seven pairs of attenuation circuits in FIG. 8 may be generated as follows: S1=b1, S2=b2, S3=b3, S4=b4+b5+b6, S5=b5+b6, S6=b4*b5+b6, and S7=b6, where "+" denotes a logical OR operation and "*" denotes a logical AND operation. The S1 through S7 control signals may thus be easily generated from bits b1 through b6 of the binary coded Gain Select signal.

The use of both binary decoded attenuation circuits 821a through 823b for small attenuation and thermometer decoded attenuation circuits 824a through 827b for large attenuation may improve gain accuracy while reducing the number of attenuation circuits. For attenuation circuits with large attenuation, a small percentage change in resistor values due to random variations in integrated circuit (IC) fabrication process may result in a relatively large gain error in comparison to the smallest gain step of 1.5 dB. Hence, thermometer decoding may be used for the attenuation circuits with large attenuation in order to improve gain accuracy. For attenuation circuits with smaller attenuation, the same percentage change in resistor values due to random process variations may result in a relatively small gain error in comparison to the smallest gain step of 1.5 dB. Hence, binary decoding may be used for the attenuation circuits with smaller attenuation in order to reduce the number of attenuation circuits without sacrificing gain accuracy. As in the circuit 600, in order to obtain the simplest gain increments in dB units, the binary decoded attenuation circuits should be placed in front of the thermometer decoded attenuation circuits.

FIG. 8 shows an example programmable gain circuit 802 with three pairs of binary decoded attenuation circuits 821a through 823b and four pairs of thermometer decoded attenuation circuits 824a through 827b. In general, a programmable gain circuit may include any number of binary decoded attenuation circuits and any number of thermometer decoded attenuation circuits. The number of binary decoded attenuation circuits and the number of thermometer decoded attenuation circuits may be selected based on the desired overall gain range, the desired gain step, the desired gain accuracy, the expected amount of IC process variations, and/or other factors.

Figure 9:
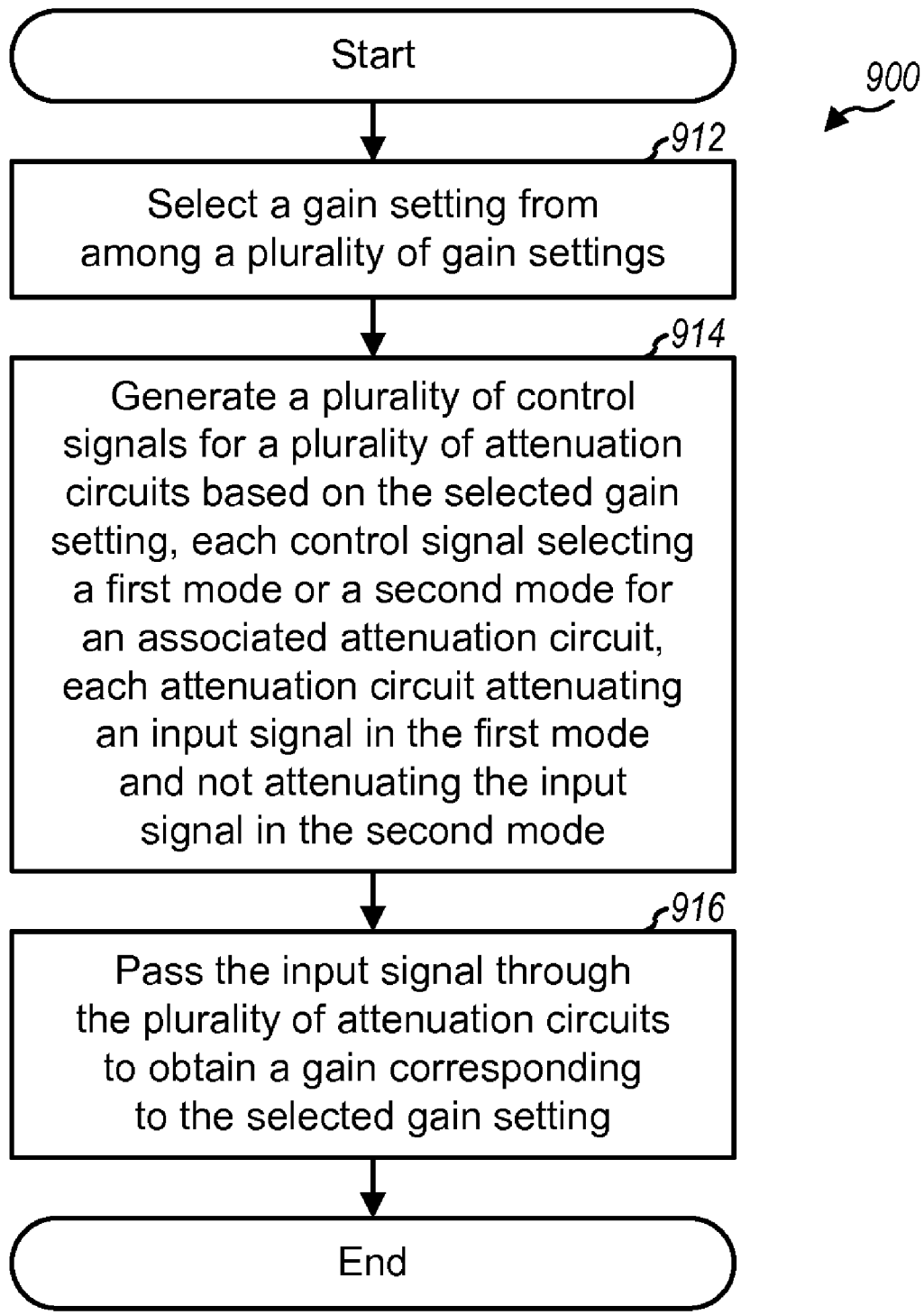
FIG. 9 shows a process for conditioning a signal.

FIG. 9 shows a flow diagram of a design of a process 900 for conditioning a signal. A gain setting may be selected from among a plurality of gain settings (block 912). A plurality of control signals may be generated for a plurality of attenuation circuits based on the selected gain setting (block 914). Each control signal may select a first/attenuation mode or a second/bypass mode for an associated attenuation circuit. Each attenuation circuit may attenuate an input signal in the first mode and bypass (or not attenuate) the input signal in the second mode. The input signal may be passed through the plurality of attenuation circuits to obtain a gain corresponding to the selected gain setting (block 916).

The plurality of attenuation circuits may comprise a set of binary decoded attenuation circuits. The control signals may be generated to select the binary decoded attenuation circuits in any order, with the selected binary decoded attenuation circuits being determined based on the selected gain setting. Alternatively or additionally, the plurality of attenuation circuits may comprise a set of thermometer decoded attenuation circuits. The control signals may be generated to select the thermometer decoded attenuation circuits in a predetermined order, with the number of selected thermometer decoded attenuation circuits being determined based on the selected gain setting. In general, the manner in which the attenuation circuits are selected may be dependent on the design of the attenuation circuits.

The programmable gain circuit described herein may be used for various applications such as communication, computing, networking, personal electronics, etc.

For example, the programmable gain circuit may be used for wireless communication devices, cellular phones, personal digital assistants (PDAs), handheld devices, gaming devices, computing devices, laptop computers, consumer electronics devices, personal computers, cordless phones, etc. An example use of the programmable gain circuit in a wireless communication device is described below.

Figure 10:
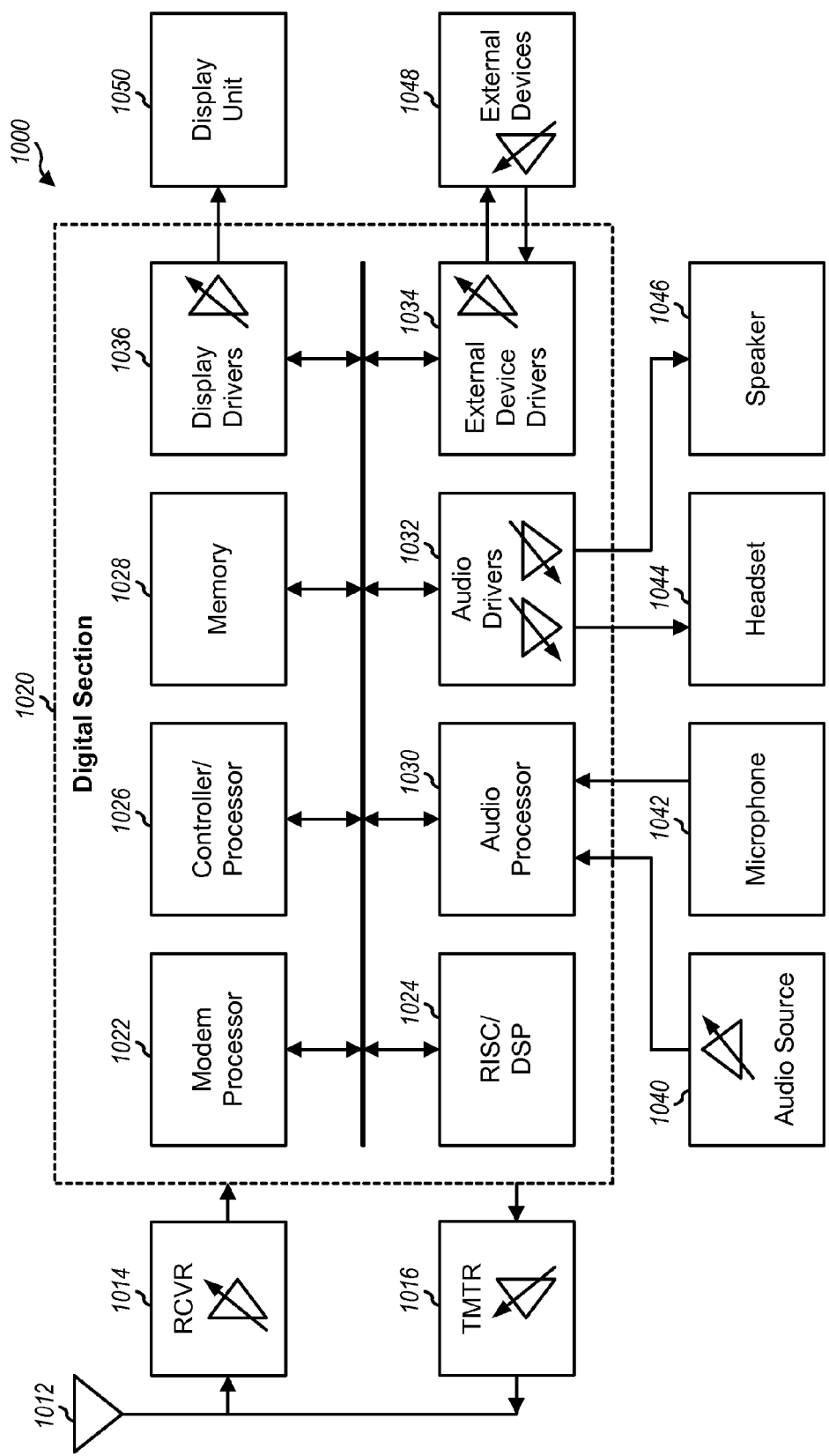
FIG. 10 shows a block diagram of a wireless communication device.

FIG. 10 shows a block diagram of a design of a wireless communication device 1000 for a wireless communication system. Wireless device 1000 may be a cellular phone, a terminal, a handset, a wireless modem, etc. The wireless communication system may be a Code Division Multiple Access (CDMA) system, a Global System for Mobile Communications (GSM) system, etc.

Wireless device 1000 is capable of providing bidirectional communication via a receive path and a transmit path. On the receive path, signals transmitted by base stations are received by an antenna 1012 and provided to a receiver (RCVR) 1014. Receiver 1014 conditions and digitizes the received signal and provides samples to a digital section 1020 for further processing. On the transmit path, a transmitter (TMTR) 1016 receives data to be transmitted from digital section 1020, processes and conditions the data, and generates a modulated signal, which is transmitted via antenna 1012 to the base stations. Receiver 1014 and transmitter 1016 may be part of a transceiver that may support CDMA, GSM, etc.

Digital section 1020 includes various processing, interface and memory units such as, for example, a modem processor 1022, a reduced instruction set computer/digital signal processor (RISC/DSP) 1024, a controller/processor 1026, a memory 1028, an audio processor 1030, audio drivers 1032, external device drivers 1034, and display drivers 1036. Modem processor 1022 may perform processing for data transmission and reception, e.g., encoding, modulation, demodulation, decoding, etc. RISC/DSP 1024 may perform general and specialized processing for wireless device 1000. Controller/processor 1026 may direct the operation of various units within digital section 1020. Memory 1028 may store data and/or instructions for various units within digital section 1020.

Audio processor 1030 may perform encoding for input signals from an audio source 1040, a microphone 1042, etc. Audio processor 1030 may also perform decoding for coded audio data and may provide output signals to audio drivers 1032. Audio drivers 1032 may drive a headset 1044, a speaker 1046, etc. External device drivers 1034 may drive external devices 1048 and/or may receive signals from external devices 1048. Display drivers 1036 may drive a display unit 1050.

As shown in FIG. 10, the programmable gain circuit may be used in various blocks in which variable gain is desirable or required. For example, the programmable gain circuit may be used in receiver 1014, transmitter 1016, audio drivers 1032, external device drivers 1034, display drivers 1036, audio source 1040, external devices 1048, etc. As a specific example, programmable gain amplifier 800 in FIG. 8 may be used for audio drivers 1032 to drive headset 1044 and/or speaker 1046.

The programmable gain circuit described herein may be implemented on an IC, an analog IC, an RF IC (RFIC), a mixed-signal IC, an application specific integrated circuit (ASIC), a printed circuit board (PCB), an electronics device, etc. The programmable gain circuit may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc.

An apparatus implementing the programmable gain circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a divider circuit configured to receive an input signal and provide an output signal; and
   at least one switch coupled to the divider circuit and configured to select a first mode or a second mode for the divider circuit, the divider circuit attenuating the input signal in the first mode and not attenuating the input signal in the second mode, the at least one switch further configured to additionally couple the divider circuit to the output signal in the second mode.

2. The apparatus of claim 1, wherein the at least one switch comprises a single-pole double-throw (SPDT) switch configured to steer an intermediate current from the divider circuit to ground in the first mode and to a circuit output in the second mode.

3. An apparatus comprising:
   a divider circuit configured to receive an input signal and provide an output signal; and
   at least one switch coupled to the divider circuit and configured to select a first mode or a second mode for the divider circuit, the divider circuit attenuating the input signal in the first mode and not attenuating the input signal in the second mode, the at least one switch further configured to additionally couple the divider circuit to one of the input signal or the output signal in the second mode, wherein the at least one switch comprises
   a first switch coupled across an input and an output of the divider circuit, and
   a second switch coupled between an intermediate port of the divider circuit and ground, the first switch being opened and the second switch being closed for the first mode, and the first switch being closed and the second switch being opened for the second mode.

4. The apparatus of claim 1, wherein the divider circuit comprises a resistor pad including
   a first resistor coupled between an input and a center node of the divider circuit,
   a second resistor coupled between the center node and an output of the divider circuit, and
   a third resistor coupled between the center node and an intermediate port of the divider circuit.

5. The apparatus of claim 1, wherein the divider circuit comprises a resistor pad including
   a first resistor coupled between an input and an output of the divider circuit,
   a second resistor coupled between the input and an intermediate port of the divider circuit, and
   a third resistor coupled between the output and the intermediate port of the divider circuit.

6. The apparatus of claim 1, wherein the divider circuit has a predetermined input impedance and a predetermined output impedance for both the first and second modes.

7. An apparatus comprising:
   a programmable gain circuit comprising a plurality of attenuation circuits coupled in series, each attenuation circuit including a divider circuit and at least one switch being operable in a first mode or a second mode and configured to attenuate an input signal in the first mode and not attenuate the input signal in the second mode, the at least one switch further configured to additionally couple the divider circuit to the output signal in the second mode.

8. The apparatus of claim 7, further comprising:
   an amplifier having an input coupled to the programmable gain circuit, the amplifier providing a fixed gain based on an output impedance of the programmable gain circuit.

9. The apparatus of claim 7, wherein the divider circuit is configured to receive the input signal and provide the output signal, and the at least one switch is coupled to the divider circuit and configured to select the first mode or the second mode for the attenuation circuit, the divider circuit attenuating the input signal in the first mode and not attenuating the input signal in the second mode.

10. An apparatus comprising:
    a programmable gain circuit comprising a plurality of attenuation circuits coupled in series, each attenuation circuit including a divider circuit and at least one switch being operable in a first mode or a second mode and configured to attenuate an input signal in the first mode and not attenuate the input signal in the second mode, the at least one switch further configured to additionally couple the divider circuit to one of the input signal or the output signal in the second mode, wherein the plurality of attenuation circuits comprise
    a set of binary decoded attenuation circuits providing different amounts of attenuation, and
    a set of thermometer decoded attenuation circuits providing equal amount of attenuation.

11. The apparatus of claim 10, wherein the binary decoded attenuation circuits are selectable in any order and the thermometer decoded attenuation circuits are selected in a predetermined order.

12. The apparatus of claim 10, wherein each of the binary decoded attenuation circuits comprises
    a divider circuit configured to receive an input signal and provide an output signal for the divider circuit,
    a first switch coupled across an input and an output of the divider circuit, and
    a second switch coupled between an intermediate port of the divider circuit and ground, the first switch being opened and the second switch being closed for the first mode, and the first switch being closed and the second switch being opened for the second mode.

13. The apparatus of claim 10, wherein each of the thermometer decoded attenuation circuits comprises
    a divider circuit configured to receive an input signal and provide an output signal, and
    a single-pole double-throw (SPDT) switch configured to steer an intermediate current from the divider circuit to ground in the first mode and to an output of the programmable gain circuit in the second mode.

14. The apparatus of claim 7, wherein the programmable gain circuit supports a plurality of gain settings corresponding to different amounts of attenuation.

15. The apparatus of claim 14, wherein the programmable gain circuit has a predetermined input impedance and a predetermined output impedance for all of the plurality of gain settings.

16. An integrated circuit comprising:
a programmable gain circuit comprising a plurality of attenuation circuits coupled in series, each attenuation circuit including a divider circuit and at least one switch being operable in a first mode or a second mode and configured to attenuate an input signal in the first mode and not attenuate the input signal in the second mode, the at least one switch further configured to additionally couple the divider circuit to the output signal in the second mode.

17. The integrated circuit of claim 16, further comprising:
an amplifier having an input coupled to the programmable gain circuit, the amplifier providing a fixed gain based on an output impedance of the programmable gain circuit.

18. The integrated circuit of claim 16, wherein the divider circuit is configured to receive the input signal and provide the output signal, and the at least one switch is coupled to the divider circuit and configured to select the first mode or the second mode for the attenuation circuit, the divider circuit attenuating the input signal in the first mode and not attenuating the input signal in the second mode.

19. The integrated circuit of claim 16, wherein the plurality of attenuation circuits comprise
a set of binary decoded attenuation circuits providing different amounts of attenuation, and
a set of thermometer decoded attenuation circuits providing equal amount of attenuation.

20. A method comprising:
selecting a gain setting from among a plurality of gain settings;
generating a plurality of control signals for a plurality of attenuation circuits based on the selected gain setting, each control signal selecting a first mode or a second mode for an associated attenuation circuit, each attenuation circuit including a divider circuit and at least one switch to attenuate an input signal in the first mode and not attenuate the input signal in the second mode additionally coupling the divider circuit to the output signal in the second mode; and
passing the input signal through the plurality of attenuation circuits to obtain a gain corresponding to the selected gain setting.

21. A method comprising:
selecting a gain setting from among a plurality of gain settings;
generating a plurality of control signals for a plurality of attenuation circuits based on the selected gain setting, each control signal selecting a first mode or a second mode for an associated attenuation circuit, each attenuation circuit including a divider circuit and at least one switch to attenuate an input signal in the first mode and not attenuate the input signal in the second mode additionally coupling the divider circuit to one of the input signal or the output signal in the second mode; and
passing the input signal through the plurality of attenuation circuits to obtain a gain corresponding to the selected gain setting,
wherein the plurality of attenuation circuits comprise a set of binary decoded attenuation circuits, and wherein the generating the plurality of control signals comprises generating the plurality of control signals to select the binary decoded attenuation circuits in any order, with the selected binary decoded attenuation circuits being determined based on the selected gain setting.

22. A method comprising:
selecting a gain setting from among a plurality of gain settings;
generating a plurality of control signals for a plurality of attenuation circuits based on the selected gain setting, each control signal selecting a first mode or a second mode for an associated attenuation circuit, each attenuation circuit including a divider circuit and at least one switch to attenuate an input signal in the first mode and not attenuate the input signal in the second mode additionally coupling the divider circuit to one of the input signal or the output signal in the second mode; and
passing the input signal through the plurality of attenuation circuits to obtain a gain corresponding to the selected gain setting,
wherein the plurality of attenuation circuits comprise a set of thermometer decoded attenuation circuits, and wherein the generating the plurality of control signals comprises generating the plurality of control signals to select the thermometer decoded attenuation circuits in a predetermined order, with the number of selected thermometer decoded attenuation circuits being determined based on the selected gain setting.

23. An apparatus comprising:
means for selecting a gain setting from among a plurality of gain settings;
means for generating a plurality of control signals for a plurality of attenuation circuits based on the selected gain setting, each control signal selecting a first mode or a second mode for an associated attenuation circuit, each attenuation circuit including a divider circuit and at least one switch to attenuate an input signal in the first mode and not attenuate the input signal in the second mode additionally coupling the divider circuit to the output signal in the second mode; and
means for passing the input signal through the plurality of attenuation circuits to obtain a gain corresponding to the selected gain setting.

24. An apparatus comprising:
means for selecting a gain setting from among a plurality of gain settings;
means for generating a plurality of control signals for a plurality of attenuation circuits based on the selected gain setting, each control signal selecting a first mode or a second mode for an associated attenuation circuit, each attenuation circuit including a divider circuit and at least one switch to attenuate an input signal in the first mode and not attenuate the input signal in the second mode additionally coupling the divider circuit to one of the input signal or the output signal in the second mode; and
means for passing the input signal through the plurality of attenuation circuits to obtain a gain corresponding to the selected gain setting,
wherein the plurality of attenuation circuits comprise a set of binary decoded attenuation circuits, and wherein the means for generating the plurality of control signals comprises means for generating the plurality of control signals to select the binary decoded attenuation circuits in any order, with the selected binary decoded attenuation circuits being determined based on the selected gain setting.

25. An apparatus comprising:

means for selecting a gain setting from among a plurality of gain settings;

means for generating a plurality of control signals for a plurality of attenuation circuits based on the selected gain setting, each control signal selecting a first mode or a second mode for an associated attenuation circuit, each attenuation circuit including a divider circuit and at least one switch to attenuate an input signal in the first mode and not attenuate the input signal in the second mode additionally coupling the divider circuit to one of the input signal or the output signal in the second mode; and means for passing the input signal through the plurality of attenuation circuits to obtain a gain corresponding to the selected gain setting, wherein the plurality of attenuation circuits comprise a set of thermometer decoded attenuation circuits, and wherein the means for generating the plurality of control signals comprises means for generating the plurality of control signals to select the thermometer decoded attenuation circuits in a predetermined order, with the number of selected thermometer decoded attenuation circuits being determined based on the selected gain setting.

* * * * *